`US010741476B2`

(12) United States Patent
Schuberth et al.

(10) Patent No.: US 10,741,476 B2
(45) Date of Patent: Aug. 11, 2020

(54) PASSIVE ELECTRICAL COMPONENT WITH THERMAL VIA

(71) Applicant: Infineon Technologies AG, Neubiberg (DE)

(72) Inventors: Christian Schuberth, Villach-Landskron (AT); David Seebacher, Villach (AT)

(73) Assignee: Infineon Technologies AG, Neubiberg (DE)

( * ) Notice: Subject to any disclaimer, the term of this patent is extended or adjusted under 35 U.S.C. 154(b) by 140 days.

(21) Appl. No.: 15/490,991

(22) Filed: Apr. 19, 2017

(65) Prior Publication Data
US 2018/0308919 A1 Oct. 25, 2018

(51) Int. Cl.
| H01L 29/00 | (2006.01) |
| H01L 23/48 | (2006.01) |
| H01L 49/02 | (2006.01) |
| H01L 23/367 | (2006.01) |
| H01L 23/522 | (2006.01) |
| H01L 23/36 | (2006.01) |
| H01L 23/66 | (2006.01) |
| H01L 23/498 | (2006.01) |

(52) U.S. Cl.
CPC ............ *H01L 23/481* (2013.01); *H01L 23/36* (2013.01); *H01L 23/3677* (2013.01); *H01L 23/522* (2013.01); *H01L 23/5222* (2013.01); *H01L 23/5223* (2013.01); *H01L 23/5227* (2013.01); *H01L 23/66* (2013.01); *H01L 28/10* (2013.01); *H01L 23/49822* (2013.01); *H01L 23/5226* (2013.01)

(58) Field of Classification Search
CPC ................. H01L 28/10; H01L 23/5227; H01L 23/49822; H01L 23/3677; H01L 23/3736; H01L 23/367; H01L 23/3738; H01L 23/5226; H01L 23/481; H01L 23/36; H01L 23/5222; H01L 23/5223; H01L 23/66; H01L 23/522
See application file for complete search history.

(56) References Cited

U.S. PATENT DOCUMENTS 5,982,630 A * 11/1999 Bhatia ................. H05K 1/0207
                                                        216/20
6,031,257 A *  2/2000 Noto ....................... H01L 24/05
                                                       257/202
(Continued)

FOREIGN PATENT DOCUMENTS

JP           2001156556 A      6/2001

*Primary Examiner* — Shouxiang Hu
(74) *Attorney, Agent, or Firm* — Murphy, Bilak & Homiller, PLLC

(57) ABSTRACT

A passive electrical component includes a substrate. A first metallization layer is formed on the substrate. A first dielectric layer is formed on the first metallization layer The first dielectric layer has a lower thermal conductivity than the substrate. A second metallization layer is formed on the first dielectric layer. An electrically conductive via provides an electrical connection between a first section of the first metallization layer and a second section of the second metallization layer. A thermally conductive via provides a thermally conductive path between the second section and the substrate. The thermally conductive via provides an open circuit termination to the second section of the second metallization layer.

19 Claims, 4 Drawing Sheets

(56) References Cited

U.S. PATENT DOCUMENTS

| | | | |
|---|---|---|---|
| 6,046,503 A * | 4/2000 | Weigand | H01L 23/5329 |
| | | | 257/508 |
| 6,429,504 B1 * | 8/2002 | Beaussart | H01L 23/5227 |
| | | | 257/516 |
| 7,843,008 B2 * | 11/2010 | Okushima | H01L 27/0266 |
| | | | 257/355 |
| 9,337,797 B2 | 5/2016 | Muto | |
| 2003/0151131 A1 | 8/2003 | Deeter et al. | |
| 2005/0023692 A1 * | 2/2005 | Matsunaga | H01L 23/367 |
| | | | 257/758 |
| 2005/0167801 A1 * | 8/2005 | Kerr | H01L 23/3677 |
| | | | 257/678 |

* cited by examiner

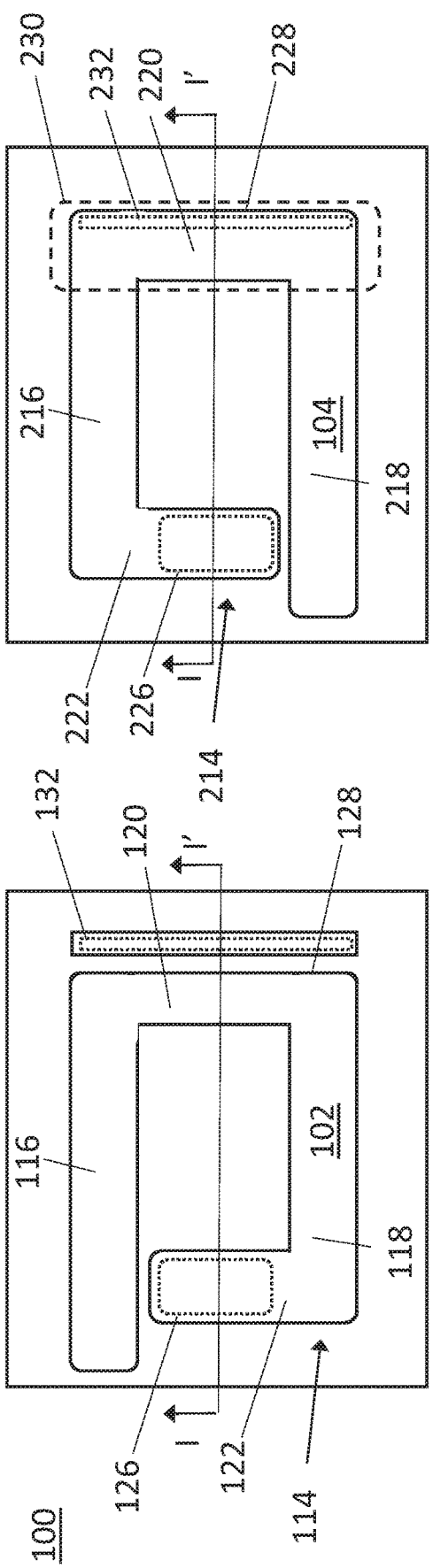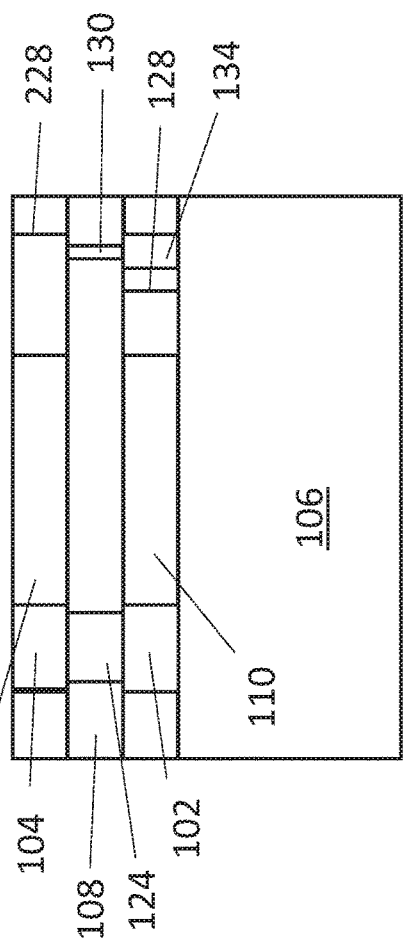

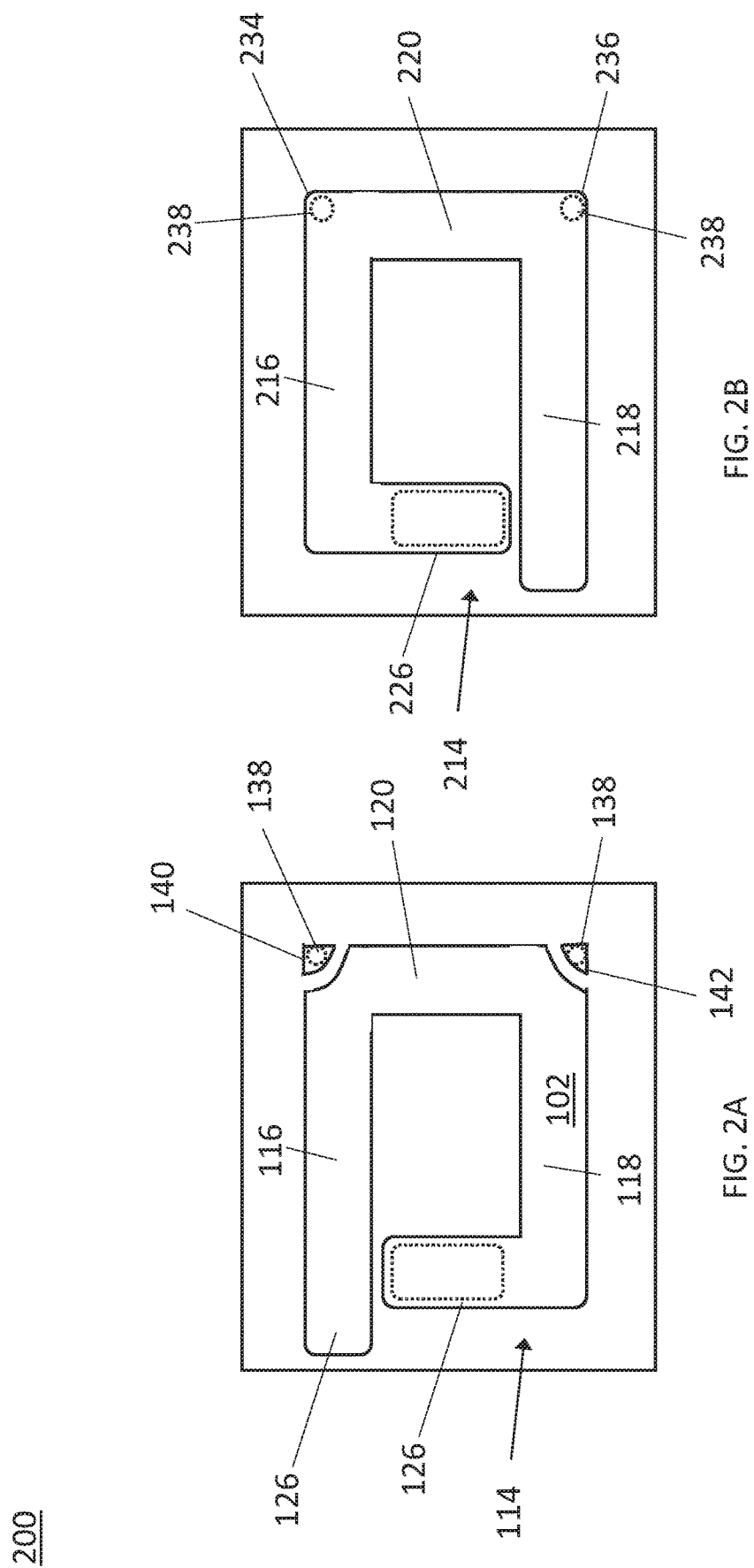

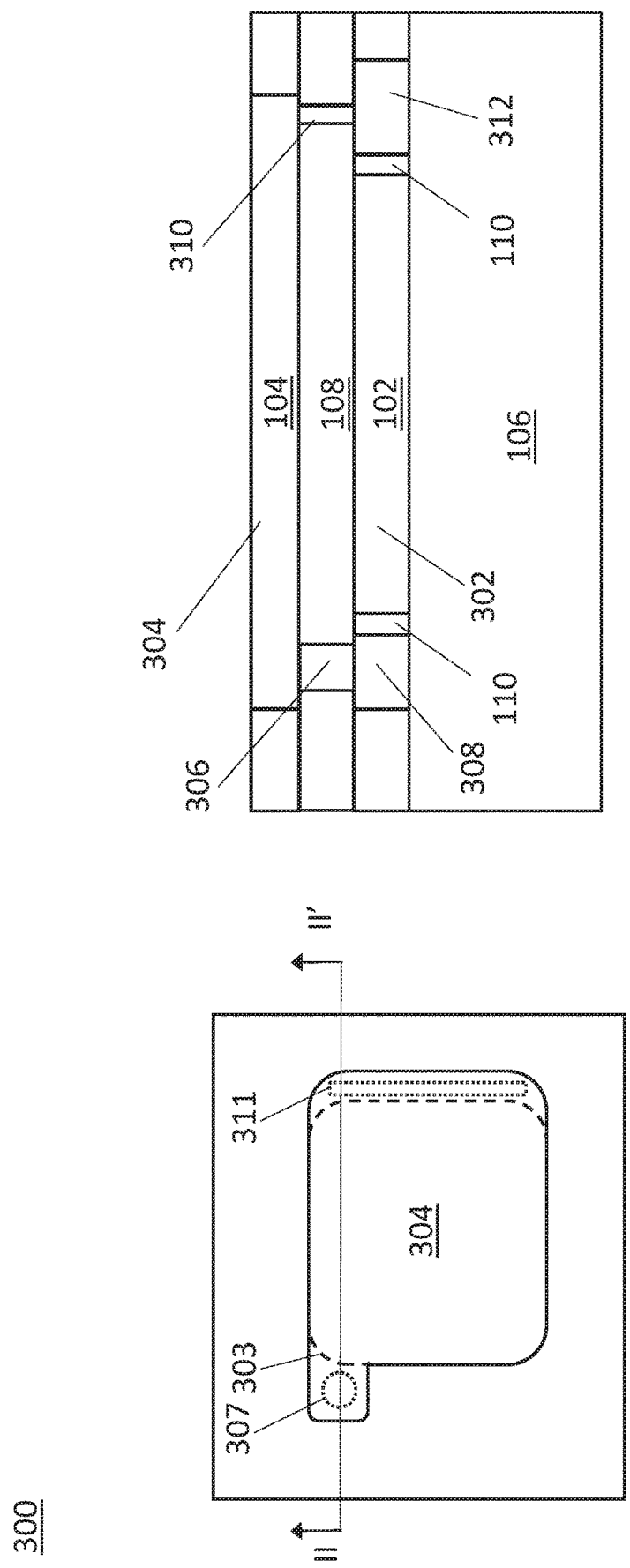

PASSIVE ELECTRICAL COMPONENT WITH THERMAL VIA

TECHNICAL FIELD

The present application relates to RF applications, and in particular techniques for the cooling of RF circuit components.

BACKGROUND

Fifth generation (5G) wireless refers to a proposed telecommunications standard that is set to replace the current fourth generation (4G) telecommunications standard. 5G aims to offer improved network capability including faster download speeds, greater bandwidth, spectral efficiency, lower latency, etc. The 5G standard will use a high frequency/short wavelength frequency spectrum, e.g., in the range of 20 GHz-60 GHz, which corresponds to wavelengths in the range of 5 mm-15 mm. In 5G systems, small die area and wide bandwidth are important design requirements.

RF transmitter/receiver circuits that are designed for RF communications systems, such as 5G systems, typically include passive electrical components to, among other things, provide impedance matching and/or to provide filtering of higher order harmonics. Examples of these passive electrical components include capacitors, inductors, transformers, baluns, etc. At higher frequencies, e.g., frequencies in the 5G range, parasitic effects become more predominant and problematic. For this reason, integrated solutions for passive electrical components are gaining increased favor, as these parasitic effects can be dramatically reduced by eliminating bond wire connections. For example, semiconductor integrated circuits can include reactive components that are formed in one or more of the back end of the line metallization layers of the device. According to another technique, a PCB-based semiconductor device package can include passive electrical components incorporated into the PCB layers. Examples of these packages are described in U.S. Pat. No. 9,629,246 to Mu, the content of which is incorporated by reference in its entirety, and U.S. application Ser. No. 15/046,923 to Mu, the content of which is incorporated by reference in its entirety.

As power consumption and/or the footprint of circuitry decreases, heat plays a critical role in the performance of the circuitry. The electrical parameters of passive electrical components such as Q-factor can be detrimentally impacted by high temperature operation. Thus, designers are seeking solutions to provide passive electrical components with a small footprint that can operate at higher frequency/power without overheating.

SUMMARY

Those skilled in the art will recognize additional features and advantages upon reading the following detailed description, and upon viewing the accompanying drawings.

A passive electrical component is disclosed. According to an embodiment, the passive electrical component includes a substrate. A first metallization layer is formed on the substrate. A first dielectric layer is formed on the first metallization layer The first dielectric layer has a lower thermal conductivity than the substrate. A second metallization layer is formed on the first dielectric layer. An electrically conductive via provides an electrical connection between a first section of the first metallization layer and a second section of the second metallization layer. A thermally conductive via provides a thermally conductive path between the second section and the substrate. The thermally conductive via provides an open circuit termination to the second section of the second metallization layer.

An inductor is disclosed. The inductor includes a substrate. A first coil is formed in a first metallization layer that is formed on substrate. A first dielectric layer is formed on the first metallization layer. The first dielectric layer has a lower thermal conductivity than the substrate. A second coil is formed in a second metallization layer that is formed on the first dielectric layer. The second coil at least partially overlaps with the first coil. An electrically conductive via provides an electrical connection between the first and second coils. A first thermally conductive via provides a thermally conductive path between the second coil and the substrate. The first thermally conductive via provides an open circuit termination to the second coil.

An integrated circuit is disclosed. The integrated circuit includes a semiconductor substrate. A first metallization layer is formed on the substrate. A first dielectric layer is formed on the first metallization layer. A second metallization layer is formed on the first dielectric layer. The first dielectric layer has a lower thermal conductivity than the substrate. The integrated circuit further includes a passive electrical component. The passive electrical component includes a first section of the first metallization layer, a second section of the second metallization layer, an electrically conductive via providing an electrically conductive connection between the first and second sections, and a thermally conductive via providing a thermally conductive path between the second section and the substrate. The integrated circuit further includes an active semiconductor device that is formed in the substrate and is electrically connected to the passive electrical component. The thermally conductive path terminates at an electrically floating portion of the substrate.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 1, which includes FIGS. 1A, 1B and 1C, illustrates an inductor with a thermal via, according to an embodiment. FIG. 1A depicts a plan view of the first metallization layer of the inductor. FIG. 1B depicts a plan view of the second metallization layer of the inductor. FIG. 1C depicts a cross-sectional view of the inductor along the line I-I' shown in FIGS. 1A and 1B.

FIG. 2, which includes FIGS. 2A and 2B, illustrates an inductor with a thermal via, according to another embodiment. FIG. 2A depicts a plan view of the first metallization layer of the inductor. FIG. 2B depicts a plan view of the second metallization layer of the inductor.

FIG. 3, which includes FIGS. 3A and 3B, illustrates a capacitor with a thermal via, according to an embodiment. FIG. 3A depicts a plan view of the second metallization layer of the capacitor. FIG. 3B depicts a cross-sectional view of the capacitor along the line II-II' shown in FIG. 3A.

FIG. 4, which includes FIG. 4A depicts a plan view of the second metallization layer of the radial stub. FIG. 4B depicts a cross-sectional view of the radial stub along the line III-III' shown in FIG. 4A.

DETAILED DESCRIPTION

Figure 4B:
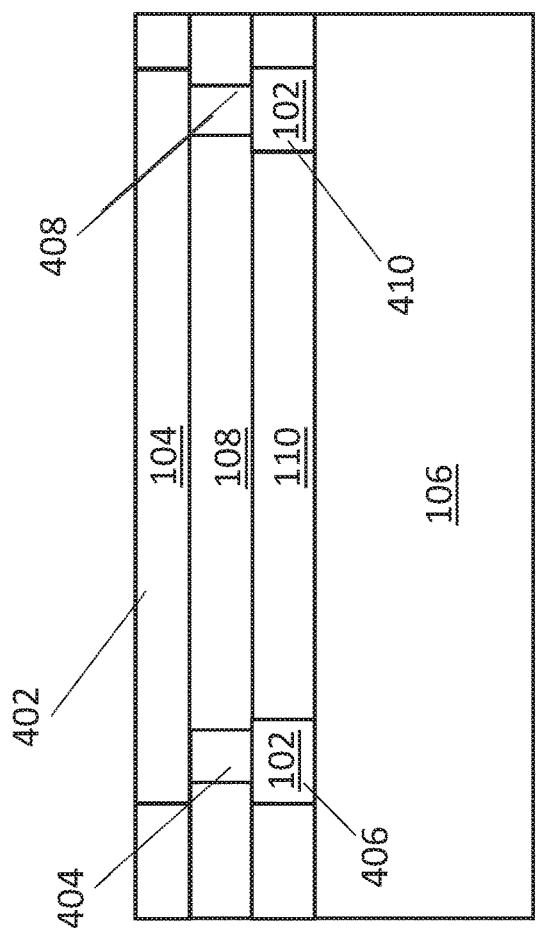
FIGS. 4A and 4B, illustrates a radial stub with a thermal via, according to an embodiment.

Embodiments described herein include a passive electrical component with a thermally conductive via that provides a thermally conductive path between a metallization portion of the passive electrical component and a thermally conductive substrate. The thermally conductive via does not provide any electrical connectivity to or from the passive electrical component, and is used solely to extract heat away from the passive electrical component. According to advantageous embodiments described herein, the thermally conductive via contacts an area of the passive component that is most susceptible to overheating during operation. For example, the thermally conductive via may contact metallized portions of the passive electrical component that are separated from a thermally conductive substrate by a thermally insulating layer and are spaced far apart from any thermal dissipation paths. By incorporating the thermally conductive via into the device, the device can operate at lower temperatures and hence perform better during high frequency/current operation. Moreover, the thermally conductive via has minimal parasitic impact on the performance of the device across all operational ranges.

Referring to FIG. 1, an inductor 100 is depicted, according to an embodiment. FIG. 1A depicts a plan view of the first metallization layer 102 of the inductor 100. FIG. 1B depicts a plan view of the second metallization layer 104 of the inductor 100. FIG. 1C depicts a cross-sectional view of the inductor 100 along the line I-I' shown in FIGS. 1A and 1B.

The inductor 100 is incorporated into a device with a substrate 106, a first metallization layer 102 formed on a surface of the substrate 106, a first interlayer dielectric layer 108 formed on the first metallization layer 102, and a second metallization layer 104 formed on the first interlayer dielectric layer 108. Additionally, first and second dielectric layers 110, 112 are provided at the vertical same level as the first and second metallization layers 102, 104, respectively. Each of the above described regions of the device may directly adjoin one another, as shown in the figures. Alternatively, one or more layers (not shown) may be interposed between some or all of these regions the device.

According to one embodiment, the inductor 100 is incorporated into a semiconductor based integrated circuit. In that case, exemplary materials for the substrate 106 include (electrical) semiconductors, e.g., group IV semiconductor materials such as silicon (Si), compound group IV semiconductor materials such as silicon carbide (SiC), and group III semiconductor materials such as, III-V semiconductor materials, such as GaN, GaAs, InGaN, AlGaN, etc.; exemplary materials for the first interlayer dielectric layer 108 and the first and second dielectric regions 110, 112 include semiconductor based insulators such as silicon dioxide ($SiO_2$), silicon nitride (SiN), silicon oxynitrides ($SiO_xN_x$); and exemplary materials for the first and second metallization layers 102, 104 include electrically conductive metals such as copper, aluminium, and alloys thereof.

According to another embodiment, inductor 100 is incorporated into a printed circuit board with a metal heat sink providing the substrate 106. In that case, exemplary materials for the substrate 106 include electrically insulating materials such as silicon dioxide ($SiO_2$), silicon nitride (SiN), silicon oxynitrides ($SiO_xN_x$), as well as thermally conductive and electrically insulating materials, e.g., diamond, and alloys thereof. Exemplary materials for the first interlayer dielectric layer 108 and the first and second dielectric regions include insulative pre-impregnated composite fiber materials, such as polytetrafluoroethylene, FR-1, FR-2, FR-3, FR-4, FR-5, FR-6, G-10, CEM-1, CEM-2, CEM-3, CEM-4, CEM-5, etc., as well as thermally conductive and electrically insulating materials, e.g., diamond, and alloys thereof; and exemplary materials for the first and second metallization layers 102, 104 include electrically conductive metals such as copper, aluminium, and alloys thereof.

The inductor 100 includes a first coil 114 that is formed in the first metallization layer 102. In the depicted embodiments, the first coil 114 has a rectangular spiral shape. That is, the first coil 114 includes two sets of rectangular elongated metallization sections that are each parallel to one another, with one of the elongated metallization sections being longer than the other three. These rectangular elongated metallization sections include first, second, third and fourth elongated sections 116, 118, 120 and 122. The first and second elongated sections 116, 118 are parallel and spaced apart from one another, and the third and fourth elongated sections 120, 122 are parallel and spaced apart from one another. The third elongated section 120 forms a continuous connection between the first and second elongated sections 116, 118. That is, the third elongated section 120 directly contacts both of the first and second elongated sections 116, 118 and provides a conductive path between the two. The fourth elongated section 122 is connected to the second elongated section 118 and detached from the first elongated section 116. That is, the fourth elongated section 122 makes direct contact with the second elongated section 118 but not the first elongated section 116. Thus, the only conductive path from the fourth elongated section 122 to the first elongated section 116 is through the second and third elongated sections, 118, 120.

The inductor 100 further includes a second coil 214 that is formed in the second metallization layer 104. In the depicted embodiments, the second coil 214 has rectangular spiral shape. The second coil 214 includes first, second, third and fourth elongated sections 216, 218, 220 and 222 of the second metallization layer 104. The first and second elongated sections 216, 218 are parallel and spaced apart from one another, and the third and fourth elongated sections 220, 222 are parallel and spaced apart from one another. The third elongated section 220 forms a continuous connection between the first and second elongated sections 216, 218. That is, the third elongated section 220 directly contacts both the first and second elongated sections 216, 218 and provides a conductive path between the two. The fourth elongated section 222 is connected to the second elongated section 218 and detached from the first elongated section 216. That is, the fourth elongated section 222 makes direct contact with the second elongated section 218 but not the first elongated section 116. Thus, the only conductive path from the fourth elongated section 222 to the first elongated section 216 is through the second and third elongated sections, 218, 220.

The inductor 100 further includes an electrically conductive via 124 that directly electrically connects the first and second coils 114, 214 together. That is, the electrically conductive via 124 provides a permanent, low-ohmic (i.e., non-rectifying) connection between the first and second coils 114, 214. A cross-sectional view of the electrically conductive via 124 is shown in FIG. 1C, and contact locations 126, 226 of the electrically conductive via 124 are superimposed in FIGS. 1A and 1B. The electrically conductive via 124 vertically extends through the first interlayer dielectric layer 108, and may be formed by depositing a metal in an opening in the first interlayer dielectric layer 108. Exemplary materials for the electrically conductive via 124 include electrically conductive metals, such as tungsten, copper, aluminum, and alloys thereof, electrically conductive semiconductors, such as highly doped polysilicon. The electrically conductive via 124 may include non-conductive resins in addition to these conductive materials, e.g., in the case that the inductor 100 is incorporated into a printed circuit board.

In a commonly known manner, the inductor 100 generates an electromagnetic field upon in the presence of an electrical current flowing through the first and second coils 114, 214. This electromagnetic field provides an inductive effect by resisting instantaneous changes in electrical current flowing through the first and second coils 114, 214. For optimal inductance, the first and second coils 114, 214 are formed to overlap with one another to the fullest extent possible. That is, the first, second, third and fourth elongated sections 216, 218, 220 and 222 of the second coil 214 are mostly disposed directly above and the first, second, third and fourth elongated sections 216, 218, 220 and 222 of the first coil 114. Moreover, the edges of the first, second, third and fourth elongated sections 216, 218, 220 and 222 of the second coil 214 laterally align with the edges of the first, second, third and fourth elongated sections 216, 218, 220 and 222 of the first coil 114, with the exception of the outer edges 128, 128 of the third elongated sections 120, 220 which will be described in further detail below.

During high current and/or high frequency operation of the inductor 100, a substantial amount of heat is generated. The material properties of the device that the inductor 100 is formed in play a significant role in how this heat is distributed throughout the inductor 100. More particularly, the thermal conductivity of the first interlayer dielectric layer 108 relative to the thermal conductivity of the substrate 106 causes an asymmetric distribution of heat throughout the inductor 100. Using any combination of material types listed above, the first interlayer dielectric layer 108 has a lower thermal conductivity than the substrate 106. Using a silicon substrate 106 and a silicon dioxide first interlayer dielectric layer 108 as an example, the thermal conductivity of the substrate 106 is about two orders of magnitude greater than the first interlayer dielectric layer 108 (e.g., between 60 and 160 W/mK for silicon and between 0.1 and 1.5 W/mK for silicon dioxide).

Because the first coil 114 lies directly on or is in close proximity to the substrate 106, heat is quickly and efficiently removed from the first coil 114 by the substrate 106 during operation. By contrast, the interlayer dielectric layer provides little to no dissipation of heat to the second coil 214 during operation. Some of the heat generated in the second coil 214 can be dissipated by the electrically conductive via 124. The electrically conductive materials that form the electrically conductive via 124 (e.g., tungsten, copper, etc.) are typically also good thermal conductors. Thus, the electrically conductive via 124 provides a heat dissipation path between the second coil 214 and the first coil 114, and ultimately the substrate 106, at one side of the second coil 214. However, with increasing distance and/or thermal isolation from the first electrical via, the impact of the electrically conductive via 124 as a heat dissipation mechanism to the second coil 214 decreases. As a result, an outer portion 230 of the second coil 214 that is maximally distant and maximally thermally isolated from the electrically conductive via 124 operates at the highest temperature during high frequency or current operation of the inductor 100.

To mitigate the above described asymmetric heat distribution issue, the inductor 100 further includes a thermally conductive via 130. The thermally conductive via 130 is configured to mitigate the asymmetric distribution of heat throughout the inductor 100 by providing an additional thermally conductive path between the second coil 214 and the substrate 106. A cross-sectional view of the thermally conductive via 130 is shown in FIG. 1C, and contact locations 132, 232 of the thermally conductive via 130 is superimposed in FIGS. 1A and 1B. The thermally conductive via 130 can be located in regions of the second coil 214 that are most susceptible to overheating, such as the outer portion 230 of the second coil 214 as described above.

According to an embodiment, the thermally conductive via 130 contacts the second coil 214 at a location that is at or substantially close to a point of maximal distance from the electrically conductive via 124. That is, the thermally conductive via 130 is spaced furthest away from the electrically conductive via 124, without necessarily accounting for the thermal conductivity of the materials laterally disposed between the two. In addition or in the alternative, the thermally conductive via 130 can contact the second coil 214 at a location that is at or substantially close to a point of maximal thermal isolation from the electrically conductive via 124. The point of maximal thermal isolation refers to a location on the second coil 214 with the most thermal resistance between the thermally conductive via 130 and the electrically conductive via 124. In other words, the thermal resistance of the material is accounted for. In the depicted example, the point of maximal distance from the electrically conductive via 124 corresponds to the outer edge side 228 of the third elongated section 120 of the first coil 114. The point of maximal thermal isolation from the first via is generally in the same location, but skews closer to the second elongated section 218 of the second coil 214 than the first elongated section 216. That is, the hottest parts of the second coil 214 during operation (in the absence of the thermally conductive via 130) are closer to the intersection of second and third elongated sections 218, 220 than the intersection of first and third elongated section 216, 220. This is due to the fact that the first elongated section 216 is directly connected to the fourth elongated section 224, which contacts the conductive via 124, whereas the second elongated section 218 does not directly contact the fourth elongated section 224.

In the embodiment of FIG. 1, the first thermally conductive via 130 is substantially close to the outer edge side 228 of the third elongated section 220. Moreover, the first thermally conductive via 130 has an elongated shape that spans across substantially an entire length of the third elongated section 220. Accordingly, the first thermally conductive via 130 is substantially close to both the point of maximal distance and the point of maximal thermal isolation from the electrically conductive via 124. This arrangement provides a direct path for the dissipation of thermal energy from the outer portion 230 of the second coil 214 to the substrate 106. The inventors have found that in such as device, the outer portion 230 of the second coil 214 is only about 15° (Centigrade) higher in temperature than the first coil 114 during a simulated operation. By way of comparison, the inventors have found that in a similarly configured inductor that does not include any thermally conductive via contacting the outer portion of the second coil, the outer portion of the second coil is approximately 35°-40° (Centigrade) higher in temperature than the first coil during normal operation. Thus, the presence of the thermally conductive via 130 reduces the difference in temperature by about 20°-25° (Centigrade).

Generally speaking, the thermally conductive via 130 can be formed from any thermally conductive material. Exemplary materials for the thermally conductive via 130 include metals such as copper, tungsten, aluminium, etc., and electrical semiconductors such as monocrystalline or polycrystalline silicon, graphite, diamond, etc. The thermally conductive via 130 can be, but is not necessarily, electrically conductive. The thermally conductive via 130 can be, but is not necessarily, formed from the same material as the electrically conductive via 124.

The thermally conductive via 130 appears as an open circuit termination to the inductor 100. That is, the thermally conductive via 130 does not provide a conduction path for the current flowing in the second coil 214 to travel to an internal or external node of the inductor 100. In this way, the thermally conductive via 130 does not directly contribute to the electrical functionality of the inductor 100, and only provides thermal dissipation to the second coil 214.

According to an embodiment, the thermally conductive via 130 directly contacts the second coil 214 and a third section 134 of the first metallization layer 102 that is laterally electrically isolated from the first coil 114. The term "laterally electrically isolated" refers to the fact that there is no direct contact between the first coil 114 and the third section 134 at the first level of metallization. Instead, a portion of the first dielectric layer 110 provides electrical isolation between the first coil 114 and the third section 134 of the first metallization layer 102 in the lateral direction. As a result, regardless of whether the thermally conductive via 130 is formed from an electrically conductive material, the thermally conductive via 130 does not provide an electrical connection between the first and second coils 114, 214.

As can be seen from FIGS. 1A and 1B, the third elongated section 220 of the second coil 214 is wider than the third elongated section 120 of the first coil 114 such that the outer edge side 228 of the third elongated section 120 of the second coil 214 is laterally offset from the outer edge side 128 of the third elongated section 120 of the first coil 114. As a result, a non-overlapping portion of the second coil 214 laterally overhangs past the first coil 114. This geometry provides clearance for the thermally conductive via 130 to contact the third section 134 of the first metallization layer 102. By contrast, the electrically conductive via 124 directly contacts overlapping portions of the first and second coils 114, 214 and thus provides an electrical connection between the two.

In the embodiments in which the inductor 100 is formed as part of a semiconductor based integrated circuit, the third section 134 of the first metallization layer 102 can be formed on an electrically floating portion of the substrate 106. That is, the third section 134 of the first metallization layer 102 can be formed on a portion of the substrate 106 that is devoid of any active doped regions (e.g., source regions, body regions, drain regions, collector regions, emitter regions, etc.), and does not otherwise provide an electrical node to any semiconductor device formed in the substrate 106. In this way, the thermally conductive via 130 provides an open circuit termination. By contrast, the first coil 114 can be electrically connected to a node (e.g., source regions, body regions, drain regions, collector regions, emitter regions, etc.) of an active semiconductor device that is formed in the substrate 106. This electrical connection can be effectuated by direct contact between the first coil 114 and the substrate 106 or alternatively through further electrical routing (not shown) using back end of the metallization layers. Likewise, the second coil 214 of the inductor 100 can be electrically connected to electrically connected to the a node (e.g., source regions, body regions, drain regions, collector regions, emitter regions, etc.) of an active semiconductor device that is formed in the substrate 106 through further electrical routing (not shown) using back end of the metallization layers. Alternatively, the first or second coil 114, 214 can be connected to externally accessible terminals of the device using back end of the metallization layers.

Referring to FIG. 2, an inductor 200 is depicted, according to another embodiment. FIG. 2A depicts a plan view of the first metallization layer 102 and FIG. 2B depicts a plan view of the second metallization layer 104. The various features of the inductor 200 of FIG. 2 can be substantially similar or identical to the inductor 100 described with reference to FIG. 1, with the exception of the configuration of the thermally conductive vias 130 and the changes to the geometry of the first and second metallization layers 102, 104 to be described herein. Different to the embodiment of FIG. 1, the inductor 100 according the embodiment of FIG. 2 includes two of the thermally conductive vias 130, namely, a first thermally conductive via 130 that is disposed substantially close to a first outer corner 234 of the second coil 214 and a second thermally conductive via 130 that is disposed substantially close to a second outer corner 236 of the second coil 214. The first outer corner 234 corresponds to an intersection between outer edge sides of the first and third elongated sections 216, 220 of the second coil 214. The second outer corner 236 corresponds to an intersection between outer edge sides of the second and third elongated sections 218, 220 of the second coil 214. Contact locations 138, 238 of the thermally conductive vias 130 are superimposed in FIGS. 2A and 2B.

Both of the first and second thermally conductive vias 130 provide a thermally conductive path between the second coil 214 and the substrate 106 in the manner previously described. Moreover, both of the first and second thermally conductive vias 130 provide an open circuit termination to the second coil 214 in the manner previously described. To this end, third and fourth portions 140, 142 of the first metallization layer 102, which are both laterally electrically isolated from the first coil 114, are formed in the first metallization layer 102. The first and second thermally conductive vias 130 can directly contact the second coil 214 and these third and fourth portions 140, 142 of the first metallization layer 102, according to an embodiment.

The embodiments described with reference to FIG. 1 and FIG. 2 offer different tradeoffs with respect to electrical and thermal performance. In the embodiment of FIG. 1, the non-overlapping portion of the second coil 214, which is necessary to provide clearance for the first thermally conductive via 130, introduces asymmetry between the first and second coils 114, 214. As a result, the electrical performance parameters (e.g., inductance and Q-factor) of the embodiment of FIG. 1 are slightly degraded (e.g., by several percentage points) in comparison to a correspondingly configured inductor 100 in which the third elongated sections 130 of the first and second coils 114, 214 are completely symmetrically aligned. By contrast, the embodiment of FIG. 2 has a design that minimizes the asymmetry between the first and second coils 114, 214. That is, with the exception of small areas near the first and second outer corners 234, 236 of the second coil 214, the third elongated sections 120, 220 of the first and second coils 114, 214 are identical in width and aligned with one another. As a result, the electrical performance parameters (e.g., inductance and Q-factor) of the embodiment of FIG. 1 are effectively identical (i.e., within less than 1 percent difference) to a correspondingly configured inductor in which the third elongated sections of the first and second coils are completely symmetrically aligned. However, the embodiment of FIG. 2 does not provide identical performance with respect to thermal dissipation, as the central regions of the third elongated section 220 are not in contact with any thermally conductive via 130. Thus, while the embodiment of FIG. 2 offers substantially better thermal performance than a corresponding inductor 100 without any of the thermally conductive vias 130 (e.g., about a 19°-24° (Centigrade) reduction in temperature between the two devices), the embodiment of FIG. 2 offers slightly worse thermal performance (e.g., about a 1°-2° (Centigrade) higher temperatures in the outer region of the second coil 214) than the embodiment of FIG. 1.

Referring to FIG. 3, a capacitor 300 is depicted, according to an embodiment. FIG. 3A depicts a plan view of the second metallization layer 104 of the capacitor 300. FIG. 3B depicts a cross-sectional view of the capacitor 300 along the line II-II' shown in FIG. 3A. The capacitor 300 is formed in a device having the substrate 106, the first metallization layer 102, the first interlayer dielectric layer 108, and the second metallization layer 104 described herein. That is, the capacitor 300 is formed in an integrated semiconductor device or alternatively formed in a printed circuit board.

The capacitor 300 is configured as a so-called parallel plate capacitor 300. A first plate 302 of the capacitor 300 is formed in the first metallization layer 102. A second plate 304 of the capacitor 300 is formed in the second metallization layer 304. An outer edge 303 of the first plate 302 of the capacitor 300 is superimposed in FIG. 3A. The first and second plates 302, 304 are electrically insulated from one other by the first interlayer dielectric layer 108.

The capacitor 300 includes an electrically conductive via 306 that provides an electrical connection between the second plate 304 of the capacitor 300 and the substrate 106. The electrically conductive via 306 is shown in the cross-sectional view of FIG. 3B and a connection location 307 of the electrically conductive via 306 is superimposed on the second plate 304 in the view of FIG. 3A.

According to an embodiment, the electrically conductive via 306 directly contacts the second plate 304 of the capacitor 300 and a first section 308 of the first metallization layer 102. The first section 308 of the first metallization layer 102 is completely electrically insulated from the first plate of the capacitor 300. To this end, as shown in FIG. 3B, a region of the first dielectric layer 110 laterally insulates the first plate 302 of the capacitor 300 from the first section 308 of the first metallization layer 102, and the first interlayer dielectric layer 108 vertically insulates the first and second plates 302, 204 of the capacitor 300 from one another. The first section 308 of the first metallization layer 102 can be used to provide an electrical connection to a substrate 106 level terminal, e.g., a doped source, body, drain, collector, emitter, etc. in the case that the capacitor 300 is formed in an integrated semiconductor device.

The capacitor 300 includes a thermally conductive via 310 that provides a thermally conductive path between the second plate 304 of the capacitor 300 and the substrate 106. The thermally conductive via 310 is shown in the cross-sectional view of FIG. 3B and a connection location 311 of the electrically conductive via 306 is superimposed on the second plate 304 in the view of FIG. 3A.

According to an embodiment, the thermally conductive via 310 directly contacts the second plate 304 of the capacitor 300 and a third section 312 of the first metallization layer 102. The thermally conductive via 310 is laterally electrically isolated from the first plate 302 of the capacitor 300 by a region of the first dielectric layer 110.

The thermally conductive via 310 adjoins a non-overlapping portion of the second plate 304 that laterally extends past the first plate 302. In this way, the thermally conductive via 130 is disposed substantially close to a point of maximal distance and/or a point of maximal thermal isolation from the electrically conductive via 306. In a similar manner as previously described with respect to the embodiment of FIG. 1, the thermally conductive via 310 thermally dissipates heat away from the second plate 304 of the capacitor 300 without substantially impacting the electrical performance of the capacitor 300.

Figure 4A:
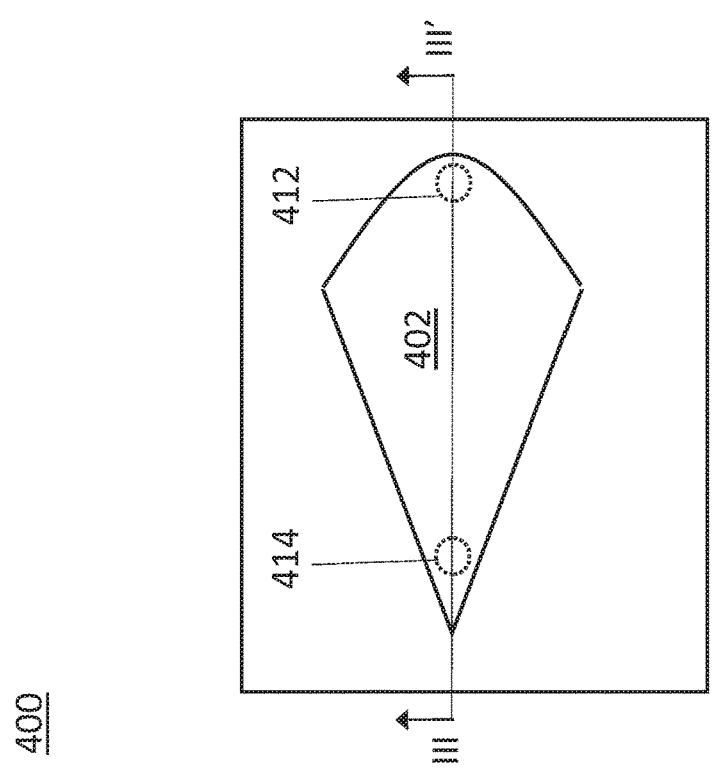

Referring to FIG. 4, a radial stub 400 is depicted, according to an embodiment. FIG. 4A depicts a plan view of the second metallization layer 104 of the radial stub 400. FIG. 4B depicts a cross-sectional view of the radial stub 400 along the line III-III' shown in FIG. 4A. The radial stub 400 is formed in a device having the substrate 106, the first metallization layer 102, the first interlayer dielectric layer 108, and the second metallization layer 104 described herein. That is, the radial stub 400 is part of an an integrated semiconductor device or alternatively part of a printed circuit board.

The radial stub 400 includes a main stub portion 402 that is formed in the second metallization layer 104. The radial stub 400 further includes an electrically conductive via 404 that provides an electrical connection between the main stub portion 402 and the substrate 106. According to an embodiment, the electrically conductive via 404 directly contacts the main stub portion 402 and a first section 406 of the first metallization layer 102. The first section 406 of the first metallization layer 102 can be used to provide an electrical connection to a substrate level terminal, e.g., a doped source region, body region, drain region, collector region, emitter region, etc. in the case that the radial stub 400 is formed in an integrated semiconductor device.

The radial stub 400 further includes a thermally conductive via 408 that provides a thermally conductive path between the main stub portion 402 and the substrate 106. According to an embodiment, the thermally conductive via 408 directly contacts the main stub portion 402 and a second section 410 of the first metallization layer 102. The second section 410 of the first metallization layer 102 is laterally electrically isolated from the first section 406 of the first metallization layer 102. To this end, as shown in FIG. 4B, a region of the first dielectric layer laterally 110 insulates the first and second sections 406, 410 of the first metallization layer 102 from one another. The second section 410 of the first metallization layer 102 can be disposed over an electrically floating portion of the substrate 106. In this way, the thermally conductive via 408 provides an open circuit termination to the main stub portion 402 in the manner previously discussed.

According to an embodiment, the thermally conductive via 408 adjoins the main stub portion 402 at a location 412 that is substantially close to a point of maximal distance and/or a point of maximal thermal isolation from the location 414 at which the electrically conductive via 404 adjoins the main stub portion 402. In a similar manner as previously described with respect to the embodiment of FIG. 1, the thermally conductive via 408 thermally dissipates heat away from the main stub portion 402 without substantially impacting the electrical performance of the radial stub 400.

The inductors 100, 200, capacitor 300, and radial stub 400 described herein represent just a few specific examples of passive electrical components with a thermally conductive via that reduces the temperature of the device during operation. The concept is not limited to the specific inductors 100, 200, capacitor 300, and radial stub 400 described herein and is applicable to any of a variety of differently configured devices. For example, the metallization layers used to form these devices are not necessarily the two lowest level metallization layers of the device. The shape of the features of these devices (e.g., the shape of the first and second coils 114, 214, the first and second plates 302, 204 or the main stub portion 402) can depart from the shapes depicted. More generally, the thermally conductive via 408 can be implemented in any of a wide variety of passive electrical device types, e.g., resistors, transformers, transmission lines, snubbers, sensors, etc.

The term "directly electrically connected," "in direct electrical contact," and the like describes a permanent low-ohmic connection between electrically connected elements, for example a wire connection between the concerned elements.

The term "thermally conductive," "thermal conductor," and the like can refer to any material with a thermal conductivity in absolute terms at or above 4.5 W/(mK), and the term "thermally insulating," "thermal insulator," and the like refer to any material with a thermal conductivity in absolute terms at or below 1.5 W/(mK). In the alternative, a "thermal insulator" and a "thermal conductor" can refer to a relative difference in thermal conductivity by a factor 100 or more between two materials.

The term "substantially" encompasses exact conformity with a requirement as well as minor deviations from exact conformity, relative to the overall dimensions of the item being described. For example, a via that "directly contacts substantially an entire length of the third elongated section" conforms with this requirement if the via contacts at least ninety percent of the length of the third elongated section. More generally, the term "substantially" encompasses any deviation that is within 10% of exact conformity. Moreover, the term "substantially" accounts for manufacturing process variations and limitations that result in a deviation from exact conformity. For example, a via that "contacts the second coil at a location that is substantially close to an outer edge side of the third elongated section" conforms with this requirement if the via is as close to the outer edge side of the third elongated section as is practically achievable by the manufacturing process. Provided that the deviation is within process tolerances so as to achieve practical conformity and the components described herein are able to function according to the application requirements, the term "substantially" encompasses any of these deviations.

The terms "lateral" or "lateral direction," and the like should be understood to mean a direction or extent that runs generally parallel to the main or upper surface of a substrate. In contrast thereto, the term "vertical" or "vertical direction" is understood to mean a direction that runs generally perpendicular to these surfaces or sides and thus to the lateral direction. The vertical direction therefore runs in the thickness direction of the substrate or carrier.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc. and are also not intended to be limiting. Like terms refer to like elements throughout the description.

As used herein, the terms "having," "containing," "including," "comprising" and the like are open ended terms that indicate the presence of stated elements or features, but do not preclude additional elements or features. The articles "a," "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

The invention claimed is:

1. A passive electrical component, comprising:
   a substrate;
   a first metallization layer formed on the substrate;
   a first dielectric layer formed on the first metallization layer, the first dielectric layer having a lower thermal conductivity than the substrate;
   a second metallization layer formed on the first dielectric layer;
   an electrically conductive via providing an electrical connection between a first section of the first metallization layer and a second section of the second metallization layer; and
   a thermally conductive via providing a thermally conductive path between the second section and the substrate,
   wherein the thermally conductive via provides an open circuit termination to the second section of the second metallization layer,
   wherein the thermally conductive via directly contacts the second section of the second metallization layer and a third section of the first metallization layer that is laterally electrically isolated from the first section of the first metallization layer,
   wherein the third section of the first metallization layer is laterally separated from the first section of the first metallization layer by a section of electrically insulating material formed on the substrate, and
   wherein the third section of the first metallization layer directly contacts the substrate.

2. The passive electrical component of claim 1, wherein the third section is formed on an electrically floating portion of the substrate.

3. The passive electrical component of claim 1, wherein the substrate has a thermal conductivity that is at least 25 times greater than a thermal conductivity of the first dielectric layer.

4. The passive electrical component of claim 3, wherein the substrate is a semiconductor substrate, and wherein the first dielectric layer comprises at least one of: a semiconductor nitride, a semiconductor oxide, and a semiconductor oxynitrides.

5. The passive electrical component of claim 1, wherein the substrate is a PCB substrate comprising a metal heat sink, and wherein the first dielectric layer comprises a pre-impregnated composite fiber material.

6. The passive electrical component of claim 1, wherein the electrically conductive via directly contacts the second section at a first location, and wherein the thermally conductive via directly contacts the second section at a second location, wherein the second location is substantially close to a point of maximal distance from the first location on the second section.

7. The passive electrical component of claim 1, wherein the electrically conductive via directly contacts the second section at a first location, and wherein the thermally conductive via directly contacts the second section at a second location, wherein the second location is substantially close to a point of maximal thermal isolation from the first location on the second section.

8. The passive electrical component of claim 1, wherein the passive electrical component is configured as an inductor.

9. The passive electrical component of claim 1, wherein the passive electrical component is configured as a capacitor.

10. The passive electrical component of claim 1, wherein the passive electrical component is a configured as a radial stub.

11. An inductor, comprising:
a substrate;
a first coil formed in a first metallization layer that is formed on substrate;
a first dielectric layer formed on the first metallization layer, the first dielectric layer having a lower thermal conductivity than the substrate;
a second coil formed in a second metallization layer that is formed on the first dielectric layer, the second coil at least partially overlapping with the first coil;
an electrically conductive via providing an electrical connection between the first and second coils; and
a first thermally conductive via providing a thermally conductive path between the second coil and the substrate,
wherein the first thermally conductive via provides an open circuit termination to the second coil,
wherein the thermally conductive via directly contacts the second coil and a third section of the first metallization layer that is laterally electrically isolated from the first coil, wherein the third section of the first metallization layer is laterally separated from the first coil by a section of electrically insulating material formed on the substrate, and
wherein the third section of the first metallization layer directly contacts the substrate.

12. The inductor of claim 11, wherein the thermally conductive via directly contacts the second coil and a third section of the first metallization layer that is laterally electrically isolated from the first coil.

13. The inductor of claim 12, wherein the third section is formed on an electrically floating portion of the substrate.

14. The inductor of claim 13, wherein the electrically conductive via directly contacts overlapping portions of the first and second coils, and wherein the thermally conductive via directly contacts a non-overlapping portion of the second coil that laterally overhangs past the first coil.

15. The inductor of claim 13, wherein the second coil has a rectangular spiral shape comprising first, second, third and fourth elongated sections, the first and second elongated sections being parallel and spaced apart from one another, the third and fourth elongated sections being parallel and spaced apart from one another, the third elongated section forming a continuous connection between the first and second elongated sections, the fourth elongated section being connected to the first elongated section and detached from the second elongated section, wherein the electrically conductive via directly contacts the fourth elongated section, and wherein the thermally conductive via directly contacts the third elongated section.

16. The inductor of claim 15, wherein the first thermally conductive via directly contacts the second coil at a location that is substantially close to an outer edge side of the third elongated section.

17. The inductor of claim 16, further comprising a second thermally conductive via providing a thermally conductive path between the second coil and the substrate, wherein the second thermally conductive via is electrically isolated from the first coil, and wherein the first and second vias contact the second coil at first and second locations that are substantially close to opposite outer corners of the third elongated section.

18. The inductor of claim 11, wherein the first and second coils each comprise an elongated span that is disposed at a point of maximal distance from the electrically conductive via, and wherein the elongated span of the second coil directly overlaps with the elongated span of the first coil and directly overlaps with the third section of the first metallization layer.

19. An integrated circuit, comprising:
a semiconductor substrate;
a first metallization layer formed on the substrate;
a first dielectric layer formed on the first metallization layer;
a second metallization layer formed on the first dielectric layer, wherein the first dielectric layer has a lower thermal conductivity than the substrate;
a passive electrical component, comprising:
a first section of the first metallization layer;
a second section of the second metallization layer;
an electrically conductive via providing an electrically conductive connection between the first and second sections;
a thermally conductive via providing a thermally conductive path between the second section and the substrate; and
an active semiconductor device formed in the substrate and being electrically connected to the passive electrical component,
wherein the thermally conductive path terminates at an electrically floating portion of the substrate,
wherein the thermally conductive via directly contacts the second section of the second metallization layer and a third section of the first metallization layer that is laterally electrically isolated from the first section of the first metallization layer,
wherein the third section of the first metallization layer is laterally separated from the first section of the first metallization layer by a section of electrically insulating material formed on the substrate, and
wherein the third section of the first metallization layer directly contacts the substrate.

* * * * *

UNITED STATES PATENT AND TRADEMARK OFFICE
CERTIFICATE OF CORRECTION

PATENT NO. : 10,741,476 B2
APPLICATION NO. : 15/490991
DATED : August 11, 2020
INVENTOR(S) : C. Schuberth et al.

Page 1 of 1

It is certified that error appears in the above-identified patent and that said Letters Patent is hereby corrected as shown below:

On the Title Page

Item [57] Line 3, change "layer The" to -- layer. The --

In the Claims

Column 13, Line 21, Claim 10, Line 2, change "is a configured" to -- is configured --

Signed and Sealed this
Twenty-ninth Day of September, 2020

Andrei Iancu
*Director of the United States Patent and Trademark Office*